United States Patent [19]  
Buhrer

[11] 3,971,126  
[45] July 27, 1976

[54] METHOD OF FABRICATING MAGNETIC FIELD DRIVE COILS FOR FIELD ACCESSED CYLINDRICAL DOMAIN MEMORIES

[75] Inventor: Carl F. Buhrer, Framingham, Mass.

[73] Assignee: GTE Laboratories Incorporated, Waltham, Mass.

[22] Filed: Sept. 18, 1975

[21] Appl. No.: 614,821

Related U.S. Application Data

[62] Division of Ser. No. 494,591, Aug. 5, 1974, Pat. No. 3,932,827.

[52] U.S. Cl. .................................. 29/604; 29/605; 336/60; 336/200; 336/220; 336/225; 340/174 MA; 340/174 TF
[51] Int. Cl.² .............................................. H01F 41/06
[58] Field of Search ............... 29/604, 605; 336/60, 336/188, 200, 220, 225; 340/174 MA, 174 TF; 335/213

[56] References Cited
UNITED STATES PATENTS

| | | | |
|---|---|---|---|
| 2,240,606 | 5/1941 | Bobb | 335/213 |
| 2,562,394 | 7/1951 | Schlesinger | 335/213 |
| 2,830,212 | 4/1958 | Hanlet | 335/213 |

FOREIGN PATENTS OR APPLICATIONS

| | | | |
|---|---|---|---|
| 673,793 | 6/1952 | United Kingdom | 29/605 |

OTHER PUBLICATIONS

"Magnetic Bubble Domain Electronic Package", by M. Zipay, IBM Tech. Disclosure Bull., vol. 16, No. 7, Dec., 1973, pp. 2129–2130.

*Primary Examiner*—Carl E. Hall  
*Attorney, Agent, or Firm*—Irving M. Kriegsman; Leslie J. Hart

[57] ABSTRACT

A magnetic field drive coil arrangement includes a hollow rectangular coil form having a pair of rectangular openings at opposite lengthwise ends of the form, a first coil wound around the coil form such that the turns of the coil in the central region of the coil form are parallel to the longitudinal axis and a second coil wound over the central portion of the first coil. The portion of the turns of the first coil which are between the access openings and the second coil curve away from the longitudinal axis of the coil form so as not to interfere with the access openings. The access openings facilitate the access to the cylindrical domain memories disposed within the coil form and the flow of a coolant through the form. Advantageous methods of fabricating the coil arrangement are described.

1 Claim, 6 Drawing Figures

METHOD OF FABRICATING MAGNETIC FIELD DRIVE COILS FOR FIELD ACCESSED CYLINDRICAL DOMAIN MEMORIES

This is a division of application Ser. No. 494,591, filed Aug. 5, 1974, now U.S. Pat. No. 3,932,827.

BACKGROUND OF THE INVENTION

The present invention relates to a magnetic drive field coil arrangement for producing a rotating magnetic field to induce propagation of cylindrical domains in bubble memories disposed therein and, more specifically, to a coil arrangement having access openings to the central region of the coil arrangement.

The storage of digital data by means of cylindrical magnetic domains in thin, single crystal films of certain orthoferrite or garnet materials has been known for some time. Such so called bubble memories can utilize domain propagation via localized fields from current pulsed conductors in contact with the film or more commonly from an etched pattern in a magnetic overlay pattern excited by an applied rotating magnetic field. This rotating magnetic field consists of two mutually perpendicular components, both in the plane of the magnetic film domain material. They are sinusoidal in their time variations and are nominally 90° apart in time phase. The coils used to produce this rotating field must be designed to accommodate the physical dimensions of the bubble memory and to produce a sufficiently uniform field over the required region. Also, their electrical properties must be such that sufficient currents can be maintained at the desired frequency without excessive voltage or heating problems. Thus, the inductance and resistance of the coils must be maintained as low as possible. It is also most desirable that the coils be constructed so there is easy access to the useable field volume to facilitate inserting and removing the bubble domain memory and its associate lead wiring without disassembling the coils. The coils should be sufficiently open to allow circulation of a coolant, such as air, to the magnetic film and also be designed such as air, to the magnetic film and also be desinged such that they can be wound or otherwise formed readily.

Bubble memory devices are usually constructed from a non-ferrimagnetic crystalline wafer substrate which is about one millimeter thick and which is covered on one side with an epitaxially grown ferrimagnetic ferrite film. The permalloy pattern used to accomplish domain propagation and any conductor patterns required for domain control or detection are either deposited on top of the magnetic film or on a separate glass plate pressed in contact with the magnetic film. In either case, the assembly is about one millimeter thick, but it can cover an area of a few square centimeters. This area can be occupied by one wafer or an assembly of several wafers side by side. They are nominally mounted in some manner on a flat support board composed of ceramic or fiberglass-epoxy composite. Leads to carry electrical signals to and from the wafers are usually formed by photoetching leads on this support board. The required magnetic fields must therefore be produced uniformly throughout a volume which is high enough to clear the relatively flat support board and its attached wafers and of sufficient area to include the entire surface area of the bubble memory devices. In addition to providing such uniform fields, the coil geometry should allow exit of the required leads and provide easy access for the insertion of the memory wafers and the flow of a coolant medium. Flat rectangular solenoids which fit together with their axes perpendicular are known, but such solenoid arrangements usually fail to satisfy one or more of the desirable requirements outlined above. More specifically, the solenoid arrangement does not have open sides. Thus, the arrangement must be disassembled to gain access to the bubble memories disposed therein. Additionally, a cooling medium can not readily flow past the memory devices while they are in use within the closed coil arrangement.

SUMMARY OF THE INVENTION

In accordance with the present invention, there is provided a magnetic field drive coil arrangement which accomplishes the desirable features previously mentioned. More specifically, the coils are disposed around a coil form which has openings at opposite lengthwise ends of the coil form. The coils are perpendicular to each other throughout the central region of the coil form which contains the bubble memory device. At least one coil has turns which are directed toward the access openings. At the ends of the form where the openings are located, the turns of such coils are disposed at an angle to the longitudinal axis such that the turns diverge away from the access openings. By this coil arrangement, ready access to the central region is provided without the need to disassemble the coils, as was the requirement in prior art devices of which the inventor is aware. Additionally, the access openings define a path along the longitudinal axis for a cooling medium, thereby permitting adequate means for removing heat from the bubble memory device while it is in use. In the central region of the coil form, the coils are perpendicular to each other so that the proper rotating magnetic field may be developed. Between each of the access openings and the central region of the overlapping coils, is a region in which only portions of the turns of one coil are present. This area is not suited for creating a rotating magnetic field of the desired uniformity and is maintained as small as possible by causing the turns to diverge sharply away from the longitudinal axis. Thus, the slight increase in the inductance and resistance of the coil due to the pressure of turns in these regions is more than off set by the desirable features of the access openings and can be minimized by increasing the length to width ratio of the coil form.

In a preferred embodiment of the invention, a first coil is disposed around the coil form such that the turns of the coil are parallel to the longitudinal axis in the central region of the coil form. The portion of the turns of this coil on either side of the longitudinal axis and between the access openings and the central region curve away from the longitudinal axis and toward the sides of the coil form. In this manner, an opening is provided to the interior of a coil from a direction which is parallel to the turns of the coil in the central, useable region. A second coil is disposed perpendicularly around the portion of the first coil where turns are parallel to the longitudinal axis. Preferably, the portions of the turns of the first coil which are curved abut one another so that the length between an access opening and the edge of the second coil is not substantially greater than a half the width of the coil form. The advantage of this feature is that the amount of conductor in the diverging regions is maintained as low as possible, thereby minimizing the resistance and inductance of the first coil. The coil arrangement is preferably mounted within an open ended metallic housing. The housing, which may be made of aluminim, is thermally and electrically conductive. Thus, the housing can serve as part of the heat sink for the coils and acts as a shield for confining the coils' electromagnetic fields. The housing does not act as a shield to steady or DC magnetic fields and, therefore, the means for creating the DC bias field for the magnetic bubble memory device need not be located within the housing. The region between the coil arrangement and the housing may be filled with a thermally conductive material to enhance the conduction of heat from the coils to the housing.

There are several unique features about the manner of fabricating the coil arrangement of the present invention. A coil form is provided whose length is equal to what eventually will be the length of the central region of the coil arrangement. A pair of coil winding blocks are each inserted into opposite ends of the coil form; the outer end of each block is triangular shaped, and a number of steps, corresponding to the desired number of turns for the first coil, are formed in the sloping sides of the triangular shaped end of the block. The first coil is then wound around the blocks and the coil form such that the length of the turns at the center are greater than those at each side of the first coil. Then, the second coil is wound over the central region of the first coil at an angle to the first coil of 90°. Preferably, a castable thermally conductive film is coated on the first coil before the second coil is wound. Next, the ends of the turns of the first coil are bent toward the sides of the coil form and away from the coil blocks so that each block may be removed. More importantly, the turns result in the desired curved arc such that the access openings are formed. The concept of using the coil block and inserting it into the coil form has made the fabrication of the coil arrangement relatively fast and effective.

THE PRIOR ART

Figure 1:
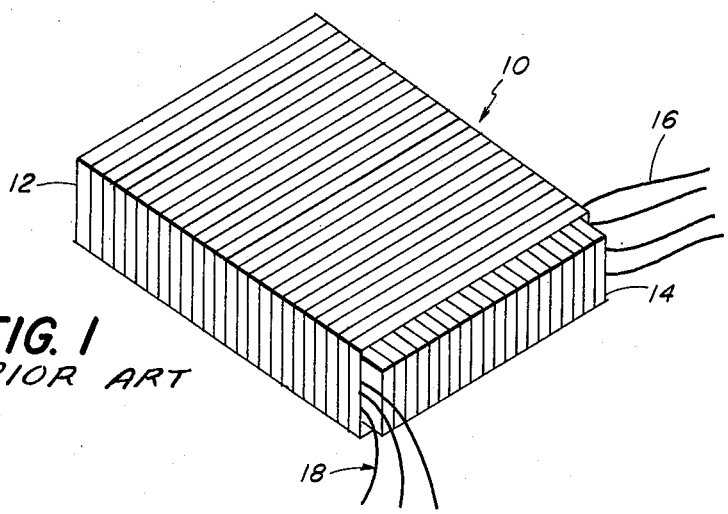
FIG. 1 is a perspective view of a known coil arrangement comprising a pair of coils which do not have access openings.

Referring now to the drawings, FIG. 1 illustrates a prior art coil arrangement for developing the rotating magnetic field for the propagation of cylindrical magnetic domains. The coil arrangement, designated generally by the reference numeral 10, comprises an outer solenoid 12 and an inner solenoid 14. Each solenoid has a number of turns of an appropriate electrical conductor. The solenoids have a generally rectangular shape as viewed from their respective open ends. As viewed from the top in FIG. 1, the solenoids have a generally square shape or, stated differently, the length to width ratio is approximately one. The solenoid 14 has slightly smaller dimensions than those of the solenoid 12 so that the solenoid 14 may be positioned within the region (not shown) enclosed by the turns of solenoid 12. The solenoids 12 and 14 are disposed perpendicularly to each other and are connected electrically by lead wires 16. The solenoid 14 may project a slight distance away from the side edge of the solenoid 12 to provide openings for lead wires 18 which must carry all the control signals to and from the memory devices. If there are parallel etched conductors on a circuit board, as is desirable to minimize problems due to crosstalk and inductive pick-up from the rotating field, the required opening is substantial, and this requires at least one of the coils to be much larger than indicated in FIG. 1. As may be observed from FIG. 1, the solenoids must be separated to obtain access to the bubble memory. Also, in operation, the coil arrangement 10 does not have a convenient means for passing a coolant through the central region (not shown) of the coil arrangement.

DESCRIPTION OF PREFERRED EMBODIMENTS

Figure 2:
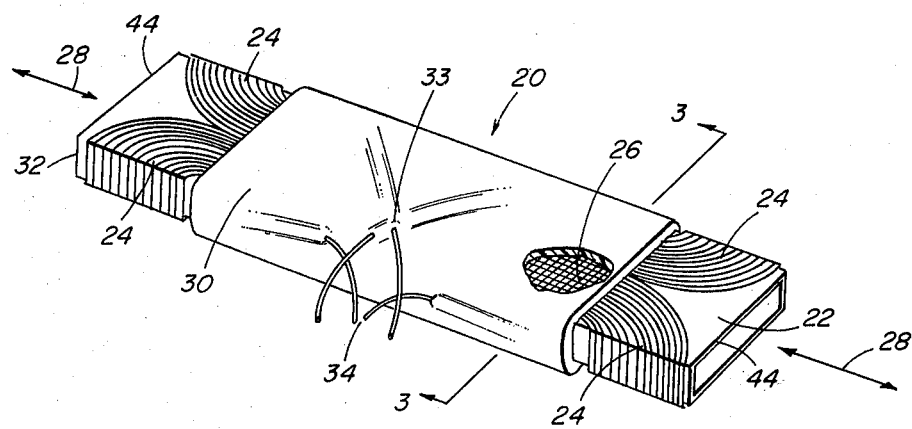
FIG. 2 is a perspective view of the preferred embodiment of the present invention.

In an exemplary embodiment of the present invention, as shown in FIG. 2, a coil arrangement 20 is illustrated and incorporates the feature of having access openings to the region in which the cylindrical magnetic domain memories are disposed. The coil arrangement 20 includes a coil form 22, a first coil 24 and a second coil 26. The coil form 22 supports the coils and constitutes a flat surface upon which the magnetic memories may be positioned. As will be described later, the form 22 actually includes three separate forms which abut each other but for the purposes herein, the form is functionally equivalent to a single structure. The form may be made of any material which has adequate physical strength and is electrically non-conductive; a typically suitable material is fiberglass reinforced epoxy. As viewed from the ends, the form 22 has a generally rectangular shape; the width dimension is large enough to accommodate the physical dimension of the magnetic memories, and the height dimension is adequate to accommodate the substrate thickness of the memory, some additional size being allowed to avoid the field non-uniformities due to edge effects. The length of the coil form, hereinafter referred to as being along the longitudinal axis 28, is greater than the width of the form; the width of the form is measured in a direction perpendicular to the longitudinal axis 28 and parallel to the top surface of the form as shown in FIG. 2. Thus, the length to width ratio is substantially greater than one.

Figure 3:
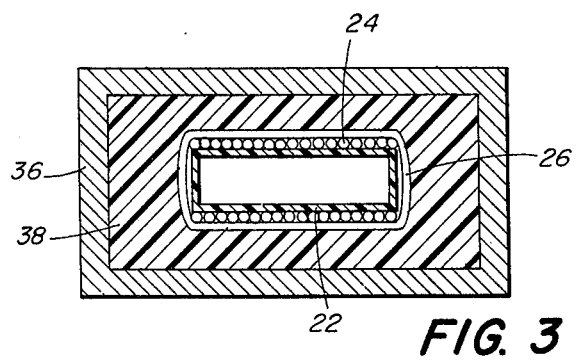
FIG. 3 is a sectional view of the preferred embodiment taken along lines 3—3 of FIG. 2 with the addition of a housing which is not shown in FIG. 2.

The coil 24 comprises a single length of an insulated electrical conductor which is wound along the longitudinal axis 28 of the coil form 22, as shown in FIG. 2. All of the turns of the coil 24 are parallel to the longitudinal axis 28 in the region which has disposed therearound a coating 30; this may be observed in the broken away portion of the coating 30 in FIG. 2. The turns then diverge away from the longitudinal axis 28 and become disposed adjacent to the side edge 32 of the coil form 22. The coil 26 is wound over the coil 24 such that the turns of the coils are perpendicular to each other. Preferably, a film of plastic material is applied over the turns of the coil 24 before the coil 26 is wound. This coating, as well as the coating 30, is a castable plastic containing a filler which has high thermal conductivity. Leads 33 and 34 for the coils 24 and 26 emerge out of the coating 30. Referring to FIG. 3, the coil arrangement may be located in a housing 36; the region between the housing and the coils is filled with a heat conductive, castable plastic material 38. The housing 36, which may be of aluminum material, is thermally conductive and primarily shields the surrounding environment from the electromagnetic fields of the coils. Another feature of the housing is that it does not shield DC magnetic fields, and thus, the means for generating the bias field for the bubble memories may be located outside the housing 36.

Typical physical dimensions and coil information for the coil arrangement are as follows:

| coil form | |
|---|---|
| height | 0.7 centimeters |
| width | 2.9 centimeters |
| length | 12.0 centimeters |
| thickness | 0.08 centimeters |
| coil 24 | |
| No. of turns | 32 |
| No. of layers | 1 |
| wire size | No. 20 gauge 0.082 centimeters |
| coil 26 | |
| length | 7.5 centimeters |
| No. of turns | 92 |
| No. of layers | 1 |
| wire size | No. 20 gauge 0.082 centimeters |

The coils provide a rotating magnetic field of about 30 oersteds when excited by peak currents of 2.5 amperes at a typical frequency of 100KH$_z$. The two currents applied to the leads of the coils 24 and 26 are 90° out of phase and are provided by resonant circuits driven by appropriate 100KH$_z$ power sources. Each coil has an inductance of approximately 21 microhenries.

The coil arrangement 20 has a pair of access openings 44. These openings permit the passage of a cooling medium, such as air, through the coil form 22 to reduce the heating of the bubble memories by the heat created by the current in the coils 24 and 26. More importantly, the openings facilitate access to the field region for inserting and removing the bubble memory devices. Also, the openings provide a means of access for signal carrying conductors which are coupled to the bubble memory devices. Since the coil assembly does not have to be disturbed during the insertion or removal of the memory devices, it can be permanently cast in place in a thermally conductive medium to provide a high degree of conduction cooling through the metal shield to an appropriate heat sink. One of the desirable features of any coil arrangement is maintaining the total inductance and resistance of the coils as low as possible and yet still obtaining the desired field strength with the adequate uniformity over a specified volume. The higher the inductance, the greater must be the voltage which excites the coil. Further, the heat generated by the coil is directly related to the coil resistance. While the diverging portions of the coil 24 do not contribute materially to the strength or uniformity of the magnetic field within the central region of the coil arrangement, their relative effect on the total inductance and resistance is maintained quite low. On the other hand, these diverging portions facilitate access to the bubble memories. It has been found that by making the width of the coil form smaller than the length, the relative contributions to the total inductance and resistance of the diverging portion of the coils can be maintained minimal. For example, increasing the length of the coil form increases the volume in which the memories may be disposed. The volume which is increased by the diverging portions of the coil 24 is directly related only to the width of the coil form and is independent of the length. For example, where the turns of the coil 24 at the diverging region abut each other, the dimensions along the longitudinal axis over which the diverging coils are present is equal to about one half the width of the coil form.

Figure 4:
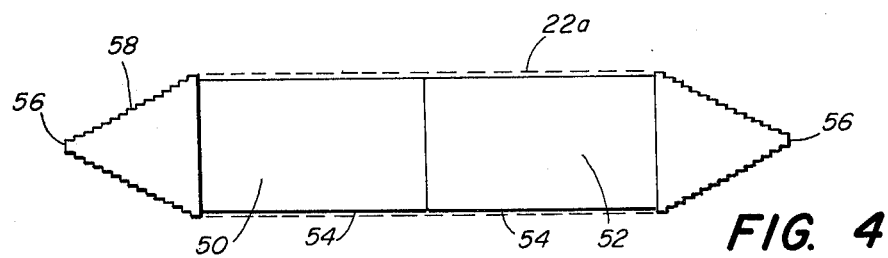
FIG. 4 is a plan view of a block assembly used to fabricate the coil arrangement of FIG. 2.

FIGS. 2, 3 and 4 in combination illustrate the various steps in the method of fabrication of the coil arrangement. In FIG. 4, each of a pair of coil winding blocks 50 and 52 has a shank 54 and a triangular member 56. The shank 54 has dimensions which conform to the inner dimensions of a coil form 22a. The shanks of each block are inserted into the coil form so that the triangular members protrude out of the ends of the coil form. Coil form 22a forms the central region of the form 22 shown in FIG. 2. In FIG. 2, coil form 22a (not shown) is surrounded by the coil 26 and the coating 30. The coil form 22 includes two more elements which are described later.

The triangular members 56 have along their tapered sides a plurality of steps 58. The coil 24 is wound onto the blocks, and each turn is located on one of the steps except for the center two which are located on the end flat of the blocks. Thus, the length of a turn at the center is the greatest, and the smallest length is at the sides. After the coil is wound, a thermally conductive film is coated on the turns which cover the coil form 22a. Then, the coil 26 is wound over the coil 24. Preferably, the coating 30 is applied over the coil 26 to hold the shape of the two coils. The blocks are then removed by bending each of the turns toward the side. After the blocks are removed, additional coil forms having a length equal to the length of the diverging portion of the coil 24 are each inserted into one end of the coil 24. The result is the assembly shown in FIG. 2.

Figure 5:
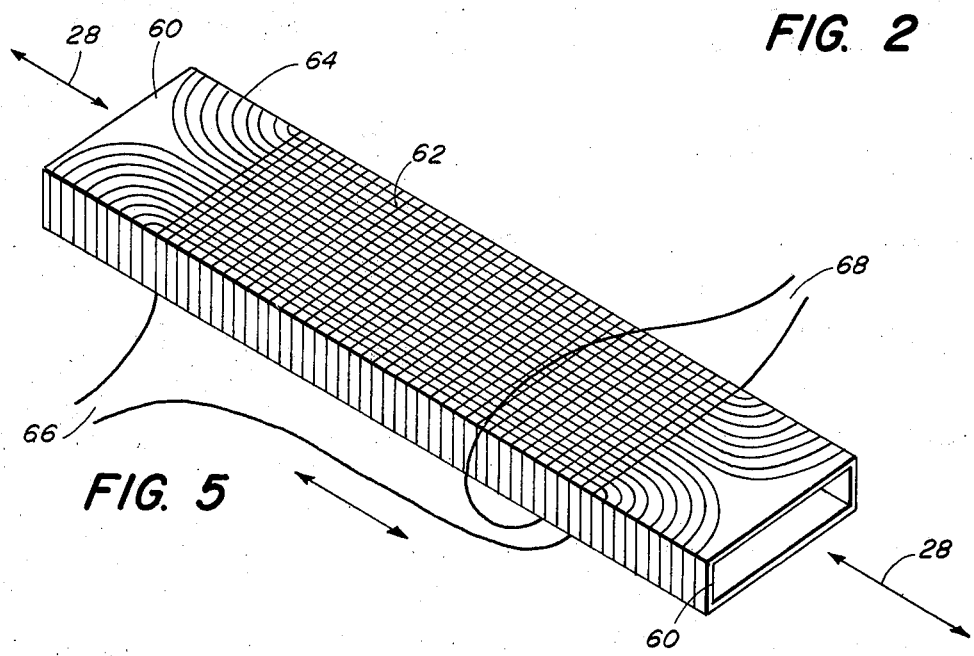
FIG. 5 is a perspective view of an alternative embodiment of the present invention.

Referring now to FIG. 5 which illustrates another embodiment, a coil form 60 has wound therearound a coil 62 which is perpendicular to the longitudinal axis 28 and a coil 64 which in the central region of the coil arrangement is parallel to the longitudinal axis 28. Beyond the central region, the turns of the coil 64 diverge away from the longitudinal axis 28, thereby not interfering with the access openings in the coil form. Coil leads 66 and 68 carry current to the two coils.

Figure 6:
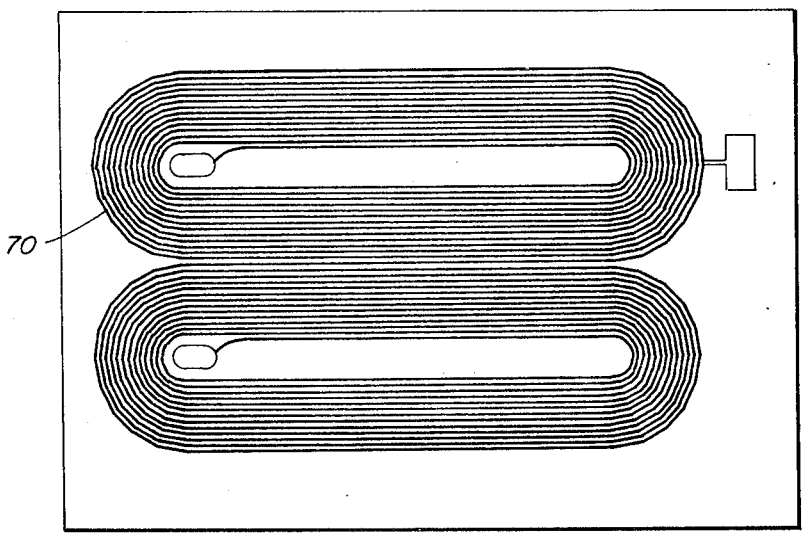
FIG. 6 is a plan view of a mask pattern which may be used in the method of fabricating one coil of the embodiment of FIG. 5.

FIG. 6 illustrates one method of making the coil 64 shown in FIG. 5. This coil 64 is not actually wound on the coil form 60, as is the case with the coil 62. Instead, one technique which is suitable makes use of a copper clad flexible insulating film, such as mylar, with a thickness of a few thousandths of an inch. A conductor pattern is formed in the copper side using photoetching techniques using a mask pattern 70, such as shown in FIG. 6. The thin copper film is then increased in thickness by electroforming additional copper or silver to form a conductor with lower resistance and greater current carrying capacity. The flexible film is then wrapped around the coil form 60 with a seam along the center of one face and with the insulating side outward to form insulation between the etched conductor and the outer coil 62. The coil 62 is composed of insulated copper wire wound with turns perpendicular to the longitudinal axis of the coil form 60.

An alternate method of constructing the coil arrangement shown in FIG. 5 is to wrap a sheet of copper around the insulated coil form 60 with the seam along the center of one face and cement it in place with a suitable adhesive. The slots can be milled through the copper to leave a conductor pattern similar to that in FIG. 6. In this way, a sufficiently thick conductor is provided without electroforming. An insulating layer would then be applied before the outer coil 62 is wound around the coil 64.

The embodiments of the present invention are merely exemplary and those skilled in the art will be able to make numerous variations and modifications without departing from the spirit of the present invention. All such variations and modifications are intended to be included within the scope of the present invention as defined in the following claims.

I claim:

1. A method of fabricating a magnetic field drive coil arrangement for field accessed cylindrical domain memories including the steps of:
   a. providing a coil form having a length which is substantially greater than the width, the form further having access openings formed therein at each lengthwise end of the form and having a longitudinal axis extending between the ends of the form,
   b. positioning a first coil around the coil form such that the turns of the first coil in a central region of the coil form are parallel to the longitudinal axis and the turns of the first coil in a pair of peripheral regions of the coil form diverge away from the longitudinal axis, the step of positioning the first coil further including:
      i. positioning a coil winding block into each access opening of the coil form, each block having a triangular shaped member with a number of slots formed in the tapered surfaces of the members, the number of slots corresponding to the number of turns of the first coil,
      ii. winding a conductor around the triangular shaped members of both blocks, each turn being located in one of the slots,
      iii. bending the turns of the first coil at the triangular shaped members toward the sides of the coil form, and then
      iv. removing the coil winding blocks from the coil form, and
   c. winding a second coil over the first coil such that the turns of the second coil and the first coil are perpendicular to each other in the central region.

* * * * *

PO-1050
(5/69)

UNITED STATES PATENT OFFICE
CERTIFICATE OF CORRECTION

Patent No. 3,971,126            Dated July 27, 1976

Inventor(s) Carl F. Buhrer

It is certified that error appears in the above-identified patent and that said Letters Patent are hereby corrected as shown below:

Column 1, lines 43 and 44, delete "such as air, to the magnetic film and also be desinged";

Column 3, line 4, delete "aluminim" and insert --aluminum--

Column 5, line 34, delete "100KH$_z$" and insert --100kHz--;
line 37, delete "100KH$_z$" and insert --100kHz--.

Signed and Sealed this

Nineteenth Day of October 1976

[SEAL]

Attest:

RUTH C. MASON
Attesting Officer

C. MARSHALL DANN
Commissioner of Patents and Trademarks